United States Patent [19]

Barraud et al.

[11] Patent Number: 4,487,661
[45] Date of Patent: Dec. 11, 1984

[54] METHOD AND DEVICE FOR DETERMINING THE PHYSICAL CHARACTERISTICS OF A SEMICONDUCTOR MATERIAL

[75] Inventors: Jean-Yves Barraud, Paris; Gérard Tourillon, Bouffemont; François Arnould, Ollainville, all of France

[73] Assignee: Compagnie Generale D'Electricite, Paris, France

[21] Appl. No.: 530,449

[22] Filed: Sep. 8, 1983

[30] Foreign Application Priority Data

Sep. 8, 1982 [FR] France .................... 82 15215

[51] Int. Cl.³ .............................. G01N 27/46
[52] U.S. Cl. .................... 204/1 T; 204/297 M; 204/40 D; 324/71.5
[58] Field of Search ........... 204/1 T, 129.3, 400, 204/401, 297 M; 324/71.5

[56] References Cited

U.S. PATENT DOCUMENTS

| | | | |
|---|---|---|---|
| 3,379,625 | 4/1968 | Csabi | 204/1 T |
| 3,530,045 | 9/1970 | Alburger | 204/1 T |
| 3,660,250 | 5/1972 | Duffy et al. | 204/1 T |
| 4,125,440 | 11/1978 | Markovits | 204/1 T |
| 4,180,439 | 12/1979 | Deines et al. | 204/1 T |

OTHER PUBLICATIONS

Cohen et al., "Monitor for Dev. of Fine Patterns in Resist Layers", IBM Tech. Dis. Bulletin, vol. 21, No. 9, Feb. 1979, pp. 3859-3861.
Charpentier et al., "Electrochem. Cell for Meas. of Physical Prop. of Semiconductors", IBM Tech. Dis. Bulletin, vol. 26, No. 4, 9/83, pp. 2020-2022.
Bogardus et al., "Silicon Dioxide Defect Detector", IBM Tech. Dis. Bulletin, vol. 20, No. 1, 6/77, pp. 432-433.

Primary Examiner—G. L. Kaplan
Assistant Examiner—Nam X. Nguyen
Attorney, Agent, or Firm—Sughrue, Mion, Zinn, Macpeak, and Seas

[57] ABSTRACT

In a method for determining the physical characteristics of a silicon wafer, one side of the wafer (4) is removably fixed to the base (2) of a container (1) so as to close off a hole (3) therein. An electrical connection to this side of the wafer (4) is made thru the hole (3). The wafer (4) forms the working electrolyte of a cell comprising an electrolyte contained in the container (1). An auxiliary electrode (14) is removably placed in the electrolyte. The method and the device implementing it can be used to determine the crystallographic and electrical characteristics of a sample of silicon.

15 Claims, 2 Drawing Figures

METHOD AND DEVICE FOR DETERMINING THE PHYSICAL CHARACTERISTICS OF A SEMICONDUCTOR MATERIAL

BACKGROUND OF THE INVENTION

1. Field of the Invention

The present invention concerns a method and a device for determining the physical characteristics of a semiconductor material. The method is of a type comprising the following consecutive steps:

removably applying a wafer of said material to the base of an insulative container having a hole in the base so as to cover said hole, placing an electrolyte in said container so that a first side of said wafer constituting a working electrode is in contact with said electrolyte, disposing an auxiliary electrode in said electrolyte opposite said working electrode, connecting a direct current electrical power source between a second side of said wafer and said auxiliary electrode, and determining the characteristics of the wafer by examining said first side.

2. Description of the Prior Art

A method of this type is disclosed in French Patent Application No. FR-A-2.344.847 (IBM). In this method, a semiconductor wafer is applied to the external wall of the base of a container formed with a hole, so as to close off this hole. The hole is fitted with a ring on which the wafer bears. The wafer is held against the ring by a stainless steel component bearing on the base of the container. An electrolyte based on hydrofluoric acid is disposed in the container. The two terminals of an electrical power source are connected respectively to the stainless steel component, this component being in contact with the wafer which serves as a main electrode, and to a platinum film immersed in the electrolyte and which serves as an auxiliary electrode.

The method described in the aforementioned French patent is limited to the detection of electrically active defects in an N type silicon substrate. Moreover, this method has disadvantages. The usable area of the wafer is delimited by that of the hole in the container. Moreover, the adjustment of the pressure of the ring on the wafer raises difficult problems, notably when the wafer is thin: insufficient pressure may result in defective sealing of the container, whereas excessive pressure may break the wafer. Note also that the stainless steel component disposed between the wafer and the power source entails the risk of introducing stray voltage drops which could falsify certain measurements.

A general objective of the present invention is to overcome these disadvantages.

SUMMARY OF THE INVENTION

The present invention consists in a method for determining the physical characteristics of a semiconductor material of the type defined hereinabove, wherein said container has a substantially plane internal wall, said second side of said wafer is disposed in contact with said wall by evacuating grooves formed in said wall via passageways formed in the bottom of said container and connected to a vacuum pump system external to said container, said hole in said container being closed off in an electrolyte-tight manner, said second side of said wafer is connected to said power source by connecting that part thereof opposite said hole thru said hole to said power source, said working and auxiliary electrodes are connected to said power source for a predetermined time interval, and said characteristics are determined at the end of said predetermined time interval.

The present invention further consists in a device for determining the physical characteristics of a semiconductor material, comprising a container, means for placing electrolyte in and removing electrolyte from said container, a substantially plane internal wall in said container adapted to permit a wafer of said semiconductor material to be disposed within said container against said wall so that a first side thereof is in contact with the electrolyte when said container contains electrolyte, grooves in said wall, a base in said container, a hole in said base, passageways in said base whereby said grooves communicate with the exterior of said container, a vacuum pump system connected to said passageways and adapted to evacuate said grooves so as to apply removably a second side of said wafer against said wall, an auxiliary electrode, removable means for placing said auxiliary electrode in said container, a direct current electrical power source, means for electrically connecting one terminal of said source to said auxiliary electrode, and means for connecting the other terminal of said source via said hole to that portion of said first side of said wafer opposite said hole.

Other objects and advantages will appear from the following description of an example of the invention, when considered in connection with the accompanying drawings, and the novel features will be particularly pointed out in the appended claims.

DESCRIPTION OF THE PREFERRED EMBODIMENT

Figure 1:
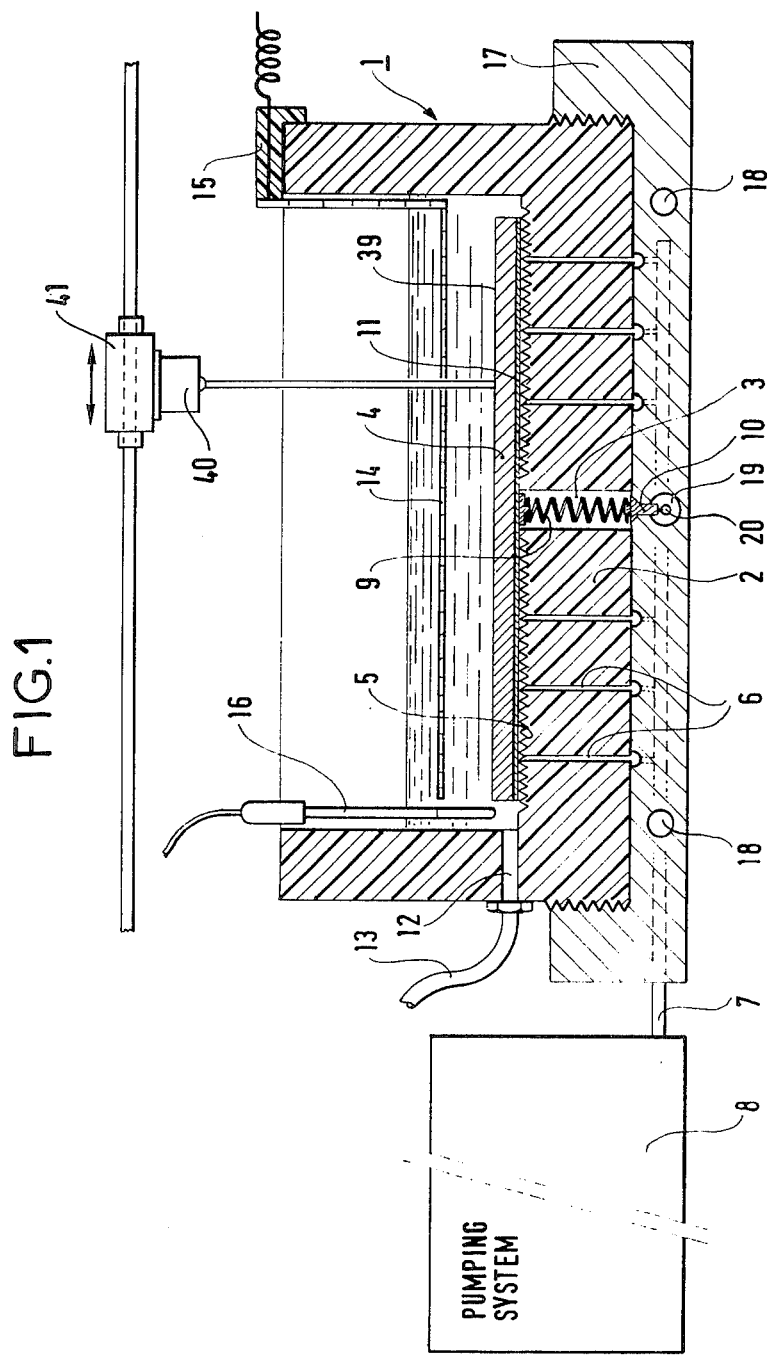
FIG. 1 shows in cross-section a cell forming part of one embodiment of a device in accordance with the invention.

FIG. 1 shows a polytetrafluorethylene container 1 which has a flat base 2 comprising a central hole 3. A wafer 4 of silicon to be evaluated is placed horizontally on the internal wall of the base 2 of the container 1, so as to cover the hole 3. The internal surface of the base 2 is formed with side by side grooves such as 5, in the form of concentric circles relative to the hole 3, for example. The base of the container comprises internal passageways such as 6 whereby these grooves communicate with a passageway 7 situated externally of the container and connected to a pumping system 8.

Within the hole 3 there is vertically disposed a coil spring 9 whose top end bears on the side of the wafer 4 which is in contact with the base of the container 1. The spring 9 is made of an electrically conductive material and its bottom end is connected to a terminal 10. For preference, the side of the wafer 4 in contact with the spring 9 is covered with an extremely thin layer 11 of conductive aluminum.

A passage 12 thru the lateral wall of the container 1 is connected externally to a polytetrafluorethylene tube 13.

A platinum auxiliary electrode 14 fixed to an insulative support 15 which simply rests on the top edge of the container 1 is disposed horizontally within the container facing the wafer 4. A calomel reference electrode 16 is disposed vertically in the container 1.

A metal support 17, preferably of stainless steel, is fixed externally to the base of the container 1, as by screwing, for example. The support 17 is provided with internal passageways 18 adapted to receive a liquid and a passageway 19 within which is disposed an electrical connecting wire 20 connected to the terminal 10.

Figure 2:
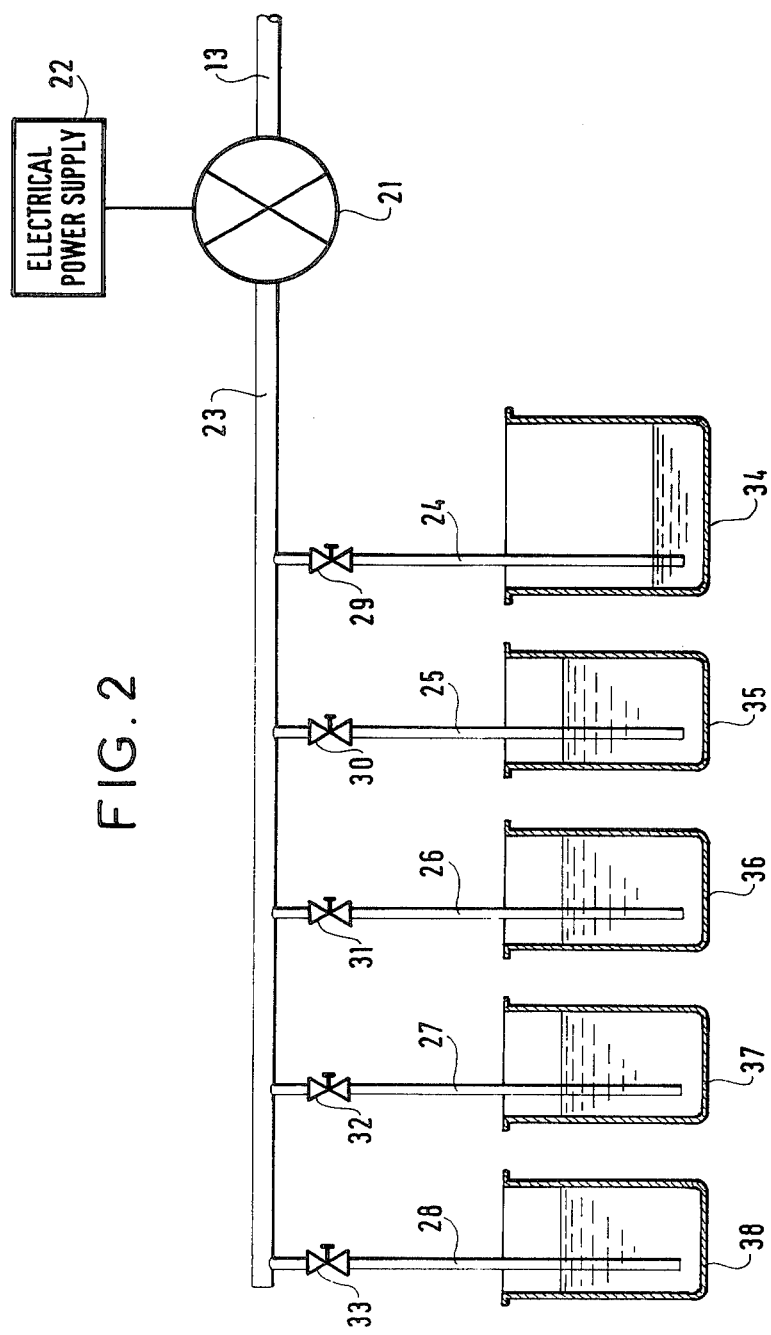
FIG. 2 is a schematic representation of the other part of the device of which the cell is shown in FIG. 1.

FIG. 2 shows an electrical pump 21 for liquids, the body of which is made from polytetrafluorethylene. This pump is supplied with power by a controllable electrical power supply device 22. The pump 21 has a liquid outlet connected to the free end of the tube 13 and another outlet connected to one end of a tube 23 the other end of which is closed. Branching from the tube 23, on the outlet side of the pump 21, are five connections 24 to 28 fitted with respective control valves 29 to 33. The free ends of these branch connections discharge into respective reservoirs 34 to 38. The tube 23, the branch connections 24 to 28, the bodies of the valves 29 to 33 and the reservoirs 34 to 38 are made from polytetrafluorethylene.

OPERATION

The device described hereinabove and shown in FIGS. 1 and 2 operates in the following manner:

Firstly, the conductive layer 11 of aluminum is deposited on a plane surface of the wafer 4 of silicon to be analyzed. This layer may be deposited, in the manner known per se, by vacuum evaporation and then heat treated at 420° C. for one quarter-hour in an inert atmosphere.

Then, with the layer 11 on the wafer resting on the internal surface of the base of the container, the pumping system 8 is started up so as to evacuate the grooves 5. The wafer is then applied against the base of the container by a pressure distributed over the entire surface of this wafer. Simultaneously, good electrical contact is established between the portion of the layer 11 facing the hole 3 and the top end of the spring 9, by virtue of the compression of this spring.

To show up electrical defects in the wafer 4, the reservoir 35 is filled with a mixture of hydrofluoric acid and alcohol, the mixture preferably comprising a solution of 5% hydrofluoric acid and an equal volume of alchohol. The pump 21 is of a type capable of transferring a liquid in the direction from the reservoir to the container 1 or vice versa. After opening the valve 30, the circuit 22 is commanded so that the mixture contained in the reservoir 35 is transferred into the container. The pump 21 is stopped when the mixture in the container 1 covers the auxiliary electrode 14. By virtue of the vacuum maintained in the grooves 5 by the pumping system 8, the wafer 4 closes off the hole 3 in a mixture-tight manner.

There is thus obtained a photo-electrochemical cell comprising a working electrode consisting of the wafer 4, an auxiliary electrode 14, a reference electrode 16 and an electrolyte consisting of the mixture contained in container 1.

The electrode 14 and the connecting wire 20 are then electrically connected to the terminals of a direct current electrical power source (not shown), so that the working electrode 4 is at a negative potential of approximately 0.5 volts relative to the electrode 14. The reference electrode 16 enables the potential on the working electrode 4 to be determined.

If necessary, the passageways 18 are connected to a system (not shown) capable of circulating a cooling liquid thru these passageways so as to maintain the temperature of the electrode at a desired value.

Voltage is applied to the electrodes for approximately 60 minutes. The dark areas which appear on the side 39 of the wafer in contact with the electrolyte are then observed. These dark areas on the wafer are areas of weak electrical response to luminous excitation, whereas the areas of unchanged brightness are areas of normal electrical response.

The removable auxiliary electrode 14 may then be removed from the container 1, so as to permit the surface 39 of the wafer, the appearance of which is representative of the local electrical characteristics of the wafer, to be photographed.

If there is no requirement to determine other characteristics of the wafer, the elecrolyte is removed from the container 1 by closing the valves 30 to 33 (FIG. 2), the valve 29 being open, and by commanding via the device 22 operation of the pump 21 in the opposite direction, so that the electrolyte is removed from the container 1 and transferred into the discard reservoir 34.

The valve 29 is then closed and the valve 32 opened. The reservoir 36 contains alcohol ($CH_3CH_2OH$). The pump 21 is operated in the direction appropriate to transfer a little alcohol into the container 1 for the purpose of washing the surface 39 of the wafer. After removing the alcohol into the reservoir 34, the pumping system 8 is stopped so that the wafer may be removed from the base of the container. The revealed areas on the surface 39 are removed by a simple wiping operation. The layer 11 may be removed by etching with a solution of equal parts by volume of hydrofluoric acid and chromic acid contained in reservoir 38. The layer 11 is then removed by a simple wiping operation. The wafer 4 of silicon is not adversely affected by the determination of its electrical characteristics.

It will now be assumed that it is required to determine the crystallographic characteristics of a silicon wafer selected as a production sample.

The deposition of the layer 11 of aluminum on one side of the wafer and the fixing of this wafer to the base of the container 1, using the pumping system 8, are carried out in exactly the same manner as previously described.

Similarly, a sufficient quantity of the electrolyte is transferred from the reservoir 35 into the container 1 to cover the auxiliary electrode 14.

The electrodes of the resulting cell are then electrically connected to a direct current electrical power source so that the working electrode 4 is at a positive potential of approximately 10 volts relative to the electrode 14.

The voltage is applied to the electrodes for approximately 25 minutes.

It is then seen that the surface 39 of the silicon wafer has taken on a multicolored appearance. During the electrochemical etching, the surface silicon is dissolved to the divalent state entailing the formation of a layer of porous silicon covered by an oxide film. In a dilute solution there are too few molecules of hydrofluoric acid to dissolve the oxide.

This oxide forms a strong film which has a different refractive index to the silicon and the thickness of which depends on the grain orientation of the crystal. The oxide thickness is in the range from 4,000 to 15,000 on the Newton scale. There is thus a reproducible correlation between the thickness and the color, with the result that:

a yellow coloration is seen for the 1.1.1. crystallographic planes, a green coloration is seen for the 2.1.1. crystallographic planes, an indigo coloration is seen for the 3.1.1. crystallographic planes, and a pinkish mauve coloration is seen for the 3.1.1. crystallographic planes.

As in the previous case, the multicolored surface of the silicon wafer may of course be photographed.

The method permits local detection of the nature of crystalline defects and determination of the size and orientation of the grains by simple observation of the etched surface.

After determining the crystallographic characteristics, the silicon wafer may be returned to its initial state by etching with a solution of equal parts by volume of hydrofluoric acid and chromic acid contained in the reservoir 38 followed by washing in alcohol contained in the reservoir 35.

It is possible to consecutively determine the electrical and crystallographic characteristics of the same silicon wafer without it being necessary to replace the electrolyte used to determine the electrical characteristics. In this case, the device for electrically biasing the electrodes preferably comprises a variable voltage source and a polarity inverter.

The device shown in FIGS. 1 and 2 offers the advantage of being usable also to determine the photovoltaic characteristics of a silicon wafer.

After applying the wafer to the base of the container in the manner previously described, there is introduced into the container a sufficient volume of an electrolyte consisting of a solution of perchloric acid contained in the reservoir 36, applying to the working electrode a positive potential of 0.5 V relative to the auxiliary electrode 14. The voltage and current between the electrodes is then measured with the surface 39 of the wafer excited by monochromatic radiation as from source 40, FIG. 1. It is also possible to determine locally the photovoltaic characteristics of the wafer by concentrating the exciting radiation on a small portion of the surface 39. The illumination may be moved over the entire surface of the wafer by means 41.

It will be understood that various changes in the details, materials and arrangements of parts, which have been herein described and illustrated in order to explain the nature of the invention, may be made by those skilled in the art within the principle and scope of the invention as expressed in the appended claims.

What we claim is:

1. A method of determining the physical characteristics of a semiconductor material by use of an insulative container, comprising the following consecutive steps:

removably applying a wafer of said material to the base of said insulative container having a hole in the base so as to cover said hole, placing an electrolyte in said container so that a first side of said wafer constituting a working electrode is in contact with said electrolyte, disposing an auxiliary electrode in said electrolyte opposite said working electrode, connecting a direct current electrical power source between a second side of said wafer and said auxiliary electrode, and determining the characteristics of said wafer by examining said first side, the improvement wherein said container base is flat, having an internal wall, a plurality of side by side evacuating grooves formed within said flat base internal wall and covering the full surface area of said wafer second side, and said method further comprising the steps of:

evacuating said grooves formed in said wall via passageways formed in the base of said container open to said grooves and connected to a vacuum pump system external to said container, closing off said hole in said container in an electrolyte-tight manner, connecting said second side of said wafer to said power source by connecting that part thereof opposite said hole through said hole to said power source, connecting said working and auxiliary electrodes to said power source for a predetermined time interval, and determining said characteristics at the end of said predetermined time interval.

2. A method according to claim 1, wherein said semiconductor material is silicon and said electrolyte is a mixture of hydrofluoric acid and alcohol.

3. A method according to claim 2, wherein said working electrode is maintained by said power source at a negative potential of approximately 0.5 volt relative to said auxiliary electrode, said predetermined time interval is of the order of 60 minutes, and said method further comprises the step of determining local electrical characteristics of the wafer by examining dark areas visible on said first side at the end of said predetermined time interval and corresponding to areas of weak electrical response to luminous excitation.

4. A method according to claim 2, wherein said working electrode is maintained by said power source at a positive potential of approximately 10 volts relative to said auxiliary electrode, said predetermined time interval is of the order of 25 minutes, and said method further comprises the step of determining local crystallographic characteristics of the wafer by examining colored areas visible on said first side at the end of said predetermined time interval, said color being representative of a specific crystallographic plane.

5. A method according to claim 2, wherein said electrolyte comprises a mixture of equal parts by volume of alcohol and an aqueous solution containing 5% hydrofluoric acid.

6. A device for determining the physical characteristics of a semiconductor material, comprising a container, means for placing an electrolyte in and removing said electrolyte from said container, a substantially plane internal wall in said container adapted to permit a wafer of said semiconductor material to be disposed within said container against said wall so that a first side thereof is in contact with the electrolyte when said container contains electrolyte, evacuating grooves in said wall, a base in said container, a hole in said base, passageways in said base whereby said grooves communicate with the exterior of said container, a vacuum pump system connected to said passageways and adapted to evacuate said grooves so as to apply removably a second side of said wafer against said wall, an auxiliary electrode, removable means for placing said auxiliary electrode in said container, a direct current electrical power source, means for electrically connecting one terminal of said source to said auxiliary electrode, and means for connecting the other terminal of said source via said hole to that portion of said first side of said wafer opposite said hole.

7. A device according to claim 6, wherein a removable conductive layer is disposed on said second side of said wafer and the connection between said other terminal of said power source and that portion opposite said hole of said second side of said wafer comprises an electrically conductive spring housed in said hole and applied by compression to said conductive layer when said pump system is operated, and means for connecting said spring to said power source.

8. A device according to claim 6, wherein said means for placing electrolyte in and removing electrolyte from said container comprise a pumping circuit connected to a reservoir of said electrolyte thru a first valve and to a passage passing thru a lateral wall of said container, said circuit comprising a pump adapted to transfer said electrolyte in the direction from said reservoir to said container and vice versa, there being a branch connection for removal of said electrolyte between said pump and said first valve and a second valve in series with said branch connection.

9. A device according to claim 8, wherein said container and said reservoir are made of polytetrafluorethylene.

10. A device according to claim 6, further comprising a metal support and means for removably fixing said base of said container to said support which is formed with internal passageways adapted to contain a circulating cooling liquid.

11. A device according to claim 6, further comprising a reference electrode disposed in said container for the purpose of determining the potential on said working electrode.

12. A device according to claim 6, further comprising a source of optical radiation from which a beam may be directed onto a part of said first side of said wafer and means for moving the beam over the entire surface thereof.

13. A device according to claim 6, further comprising means for placing in and removing from said container another electrolyte.

14. A device according to claim 6, further comprising means for placing in and removing from said container a product for cleaning said wafer and a washing product.

15. A device according to claim 6, further comprising means for recording the current flowing between said working electrode and said auxiliary electrode when connected to said terminals of said power source.

* * * * *